United States Patent
Yang et al.

(10) Patent No.: US 11,791,422 B2
(45) Date of Patent: Oct. 17, 2023

(54) SEMICONDUCTOR DEVICE WITH FISH BONE STRUCTURE AND METHODS OF FORMING THE SAME

(71) Applicant: Taiwan Semiconductor Manufacturing Co., Ltd., Hsinchu (TW)

(72) Inventors: Chih-Chuan Yang, Hsinchu (TW); Kuo-Hsiu Hsu, Taoyuan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/739,802

(22) Filed: May 9, 2022

(65) Prior Publication Data

US 2022/0262958 A1    Aug. 18, 2022

Related U.S. Application Data

(63) Continuation of application No. 16/945,298, filed on Jul. 31, 2020, now Pat. No. 11,329,168.

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02603* (2013.01); *H01L 21/28088* (2013.01);
(Continued)

(58) Field of Classification Search
CPC ......... H01L 29/78696; H01L 21/02603; H01L 21/28088; H01L 21/823807; H01L 21/823814; H01L 21/823842; H01L 21/823871; H01L 27/092; H01L 29/0649; H01L 29/0673; H01L 29/41733; H01L 29/42392; H01L 29/4908; H01L 29/6653; H01L 29/66545; H01L 29/66636; H01L 29/66742; H01L 29/78618; H01L 29/66439; H01L 29/66553; H01L 29/775; H01L 27/0924; H01L 21/823821; H01L 21/823878; H10B 10/125; H10B 10/12
(Continued)

(56) References Cited

U.S. PATENT DOCUMENTS 9,818,872 B2    11/2017  Ching et al.
9,887,269 B2    2/2018   Ching et al.
(Continued)

*Primary Examiner* — Tong-Ho Kim
(74) *Attorney, Agent, or Firm* — HAYNES AND BOONE, LLP

(57) ABSTRACT

Semiconductor device and the manufacturing method thereof are disclosed. An exemplary semiconductor device comprises a first semiconductor stack and a second semiconductor stack over a substrate, wherein each of the first and second semiconductor stacks includes semiconductor layers stacked up and separated from each other; a dummy spacer between the first and second semiconductor stacks, wherein the dummy spacer contacts a first sidewall of each semiconductor layer of the first and second semiconductor stacks; and a gate structure wrapping a second sidewall, a top surface, and a bottom surface of each semiconductor layer of the first and second semiconductor stacks.

20 Claims, 18 Drawing Sheets

(51) Int. Cl.

| | |
|---|---|
| *H01L 21/28* | (2006.01) |
| *H01L 21/8238* | (2006.01) |
| *H01L 27/092* | (2006.01) |
| *H01L 27/11* | (2006.01) |
| *H01L 29/06* | (2006.01) |
| *H01L 29/417* | (2006.01) |
| *H01L 29/423* | (2006.01) |
| *H01L 29/49* | (2006.01) |
| *H01L 29/66* | (2006.01) |
| *H10B 10/00* | (2023.01) |

(52) U.S. Cl.
CPC ............ *H01L 21/823807* (2013.01); *H01L 21/823814* (2013.01); *H01L 21/823842* (2013.01); *H01L 21/823871* (2013.01); *H01L 27/092* (2013.01); *H01L 29/0649* (2013.01); *H01L 29/0673* (2013.01); *H01L 29/41733* (2013.01); *H01L 29/42392* (2013.01); *H01L 29/4908* (2013.01); *H01L 29/6653* (2013.01); *H01L 29/66545* (2013.01); *H01L 29/66636* (2013.01); *H01L 29/66742* (2013.01); *H01L 29/78618* (2013.01); *H10B 10/125* (2023.02)

(58) Field of Classification Search
USPC .......................................................... 257/351
See application file for complete search history.

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 11,329,168 B2 * | 5/2022 | Yang ................... H01L 29/0649 |
| 2018/0175036 A1 | 6/2018 | Ching et al. |
| 2020/0035786 A1 | 1/2020 | Xie |
| 2020/0243666 A1 | 7/2020 | Ching |
| 2021/0082766 A1 * | 3/2021 | Miura ............... H01J 37/32082 |

* cited by examiner

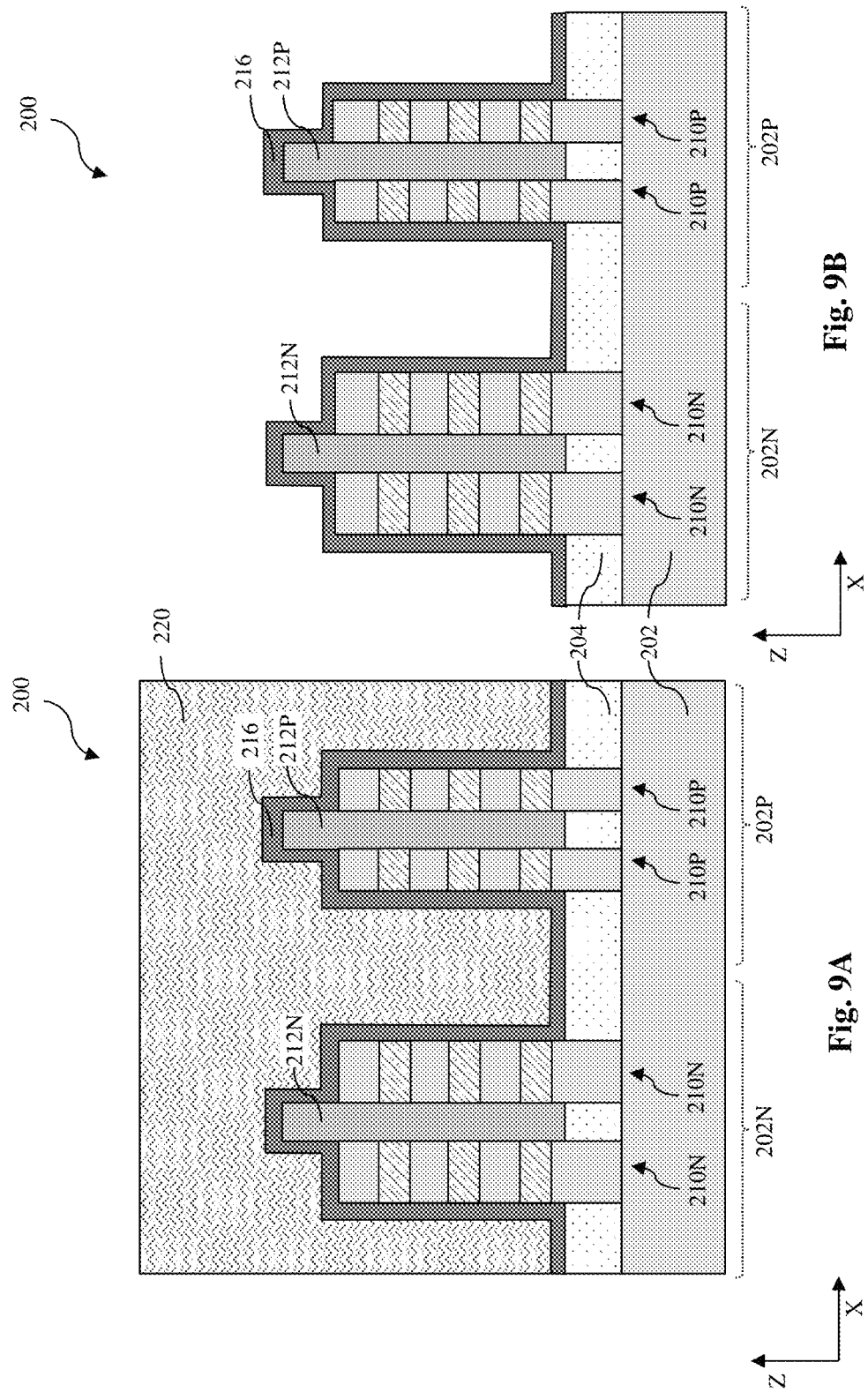

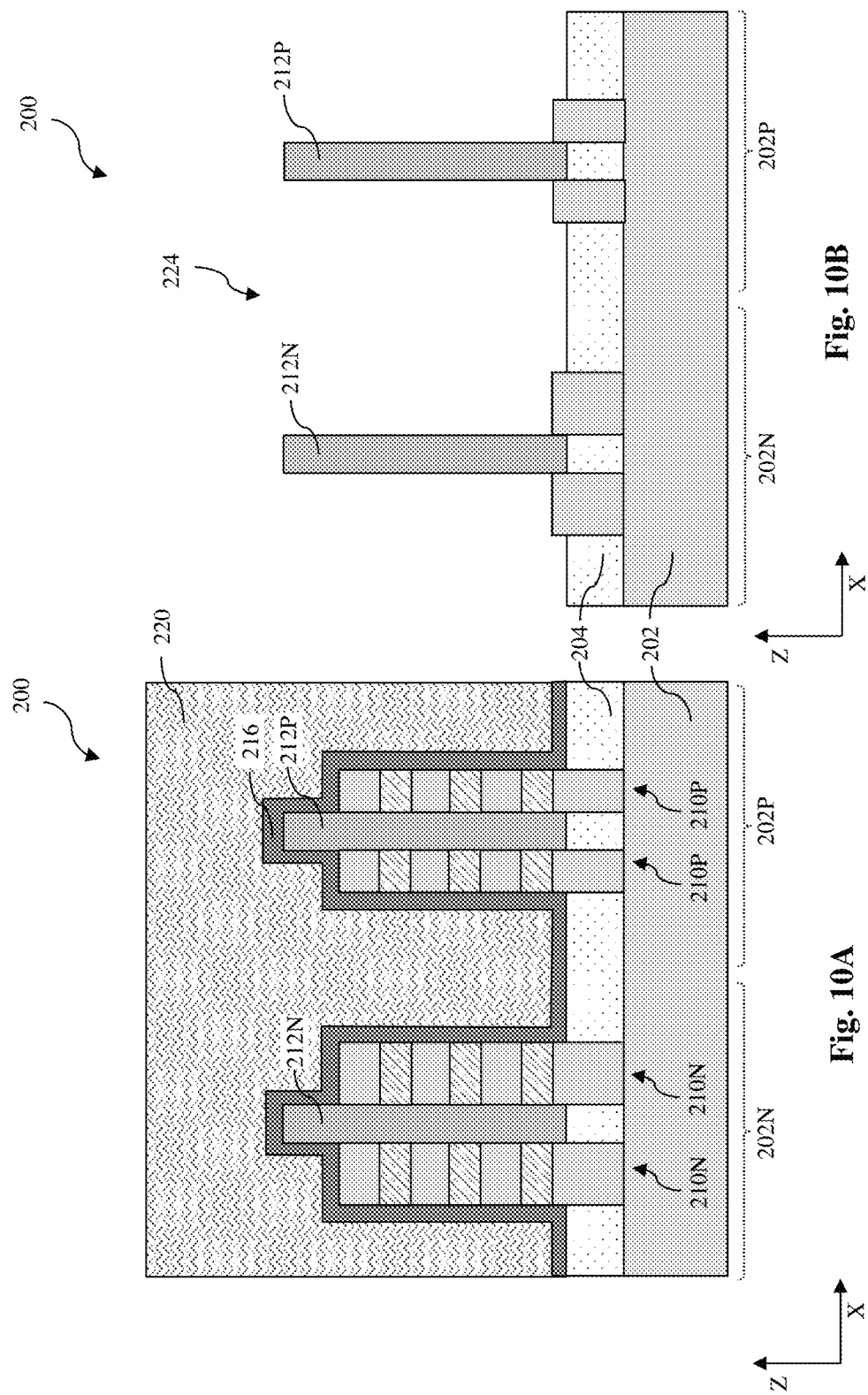

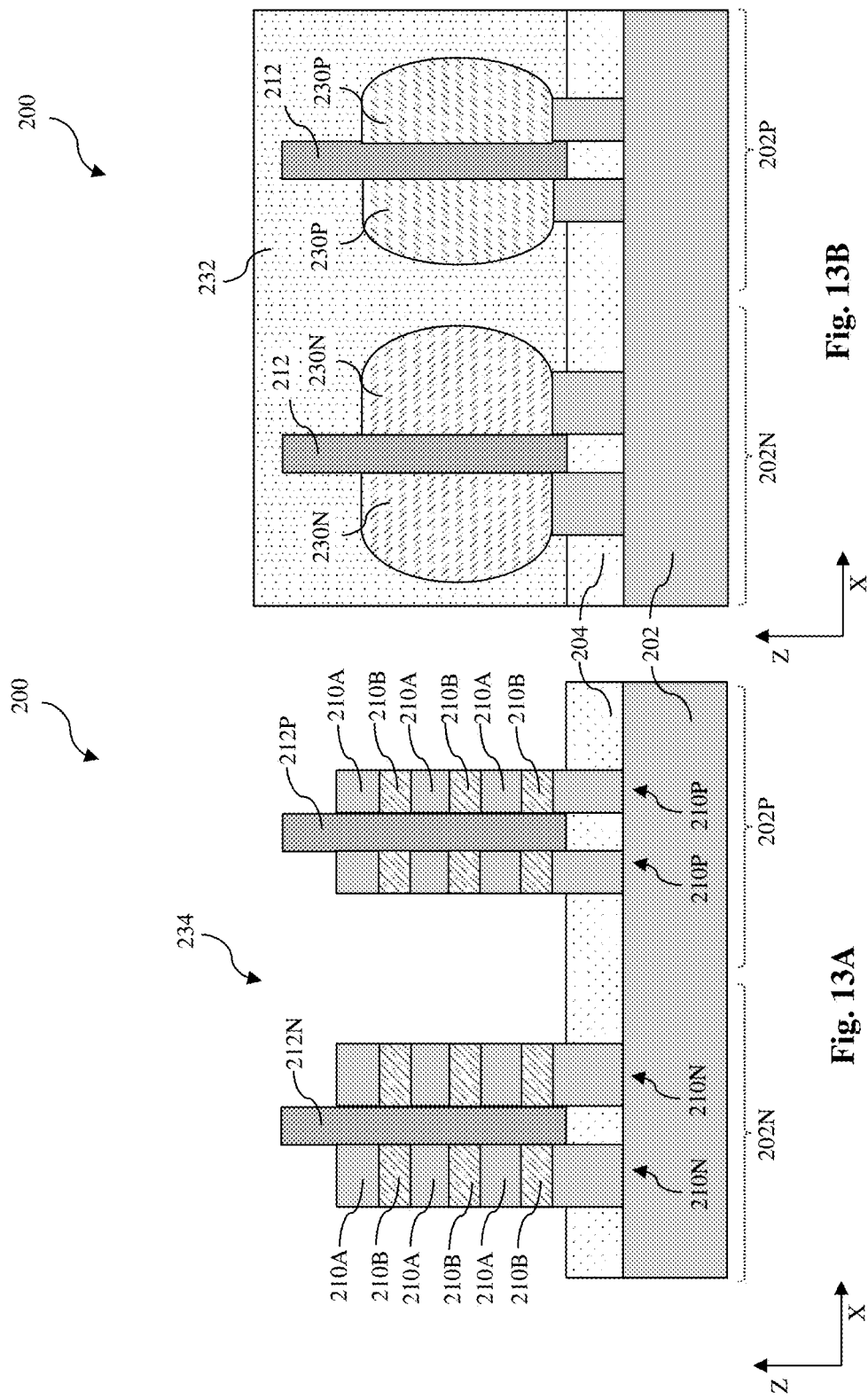

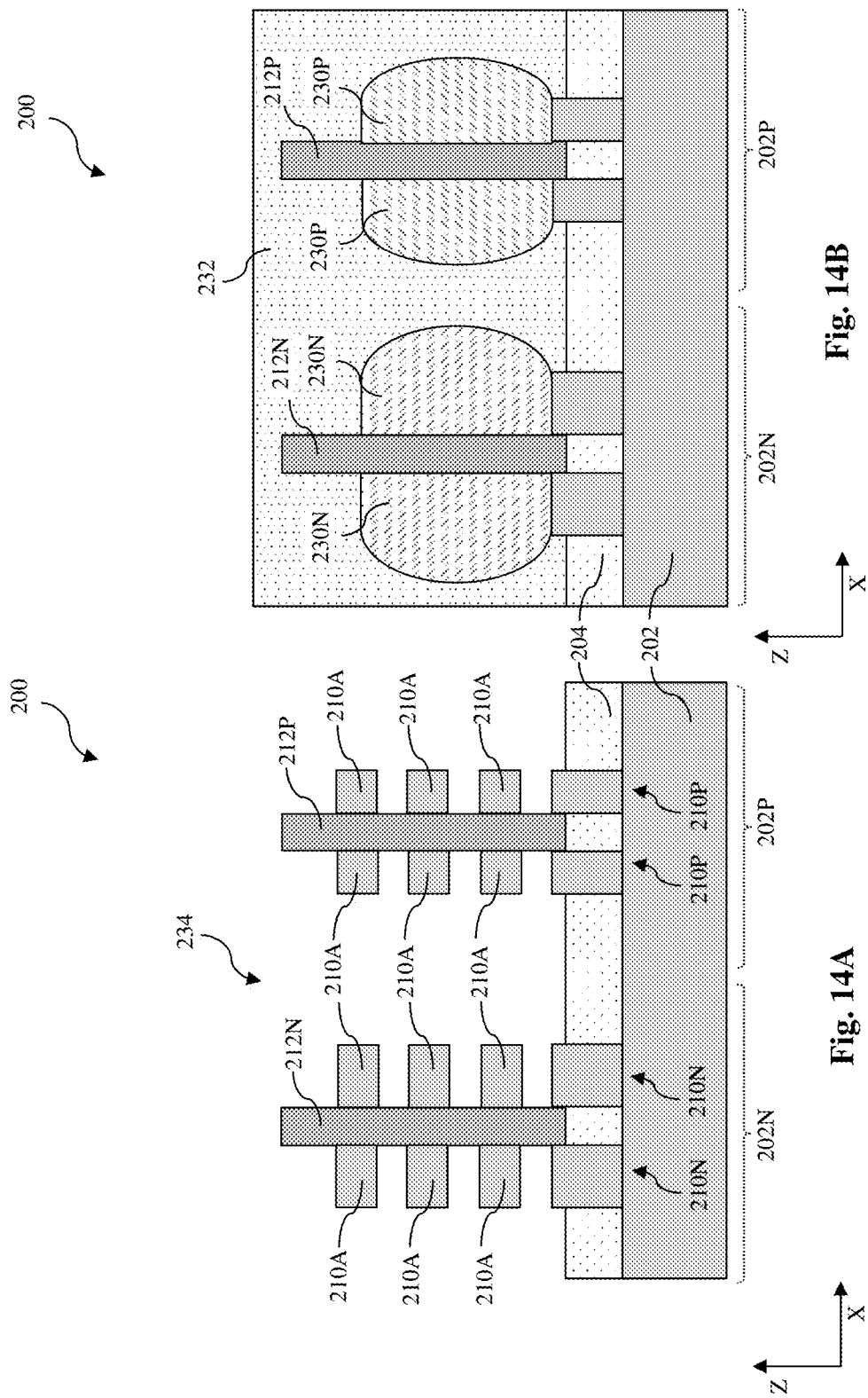

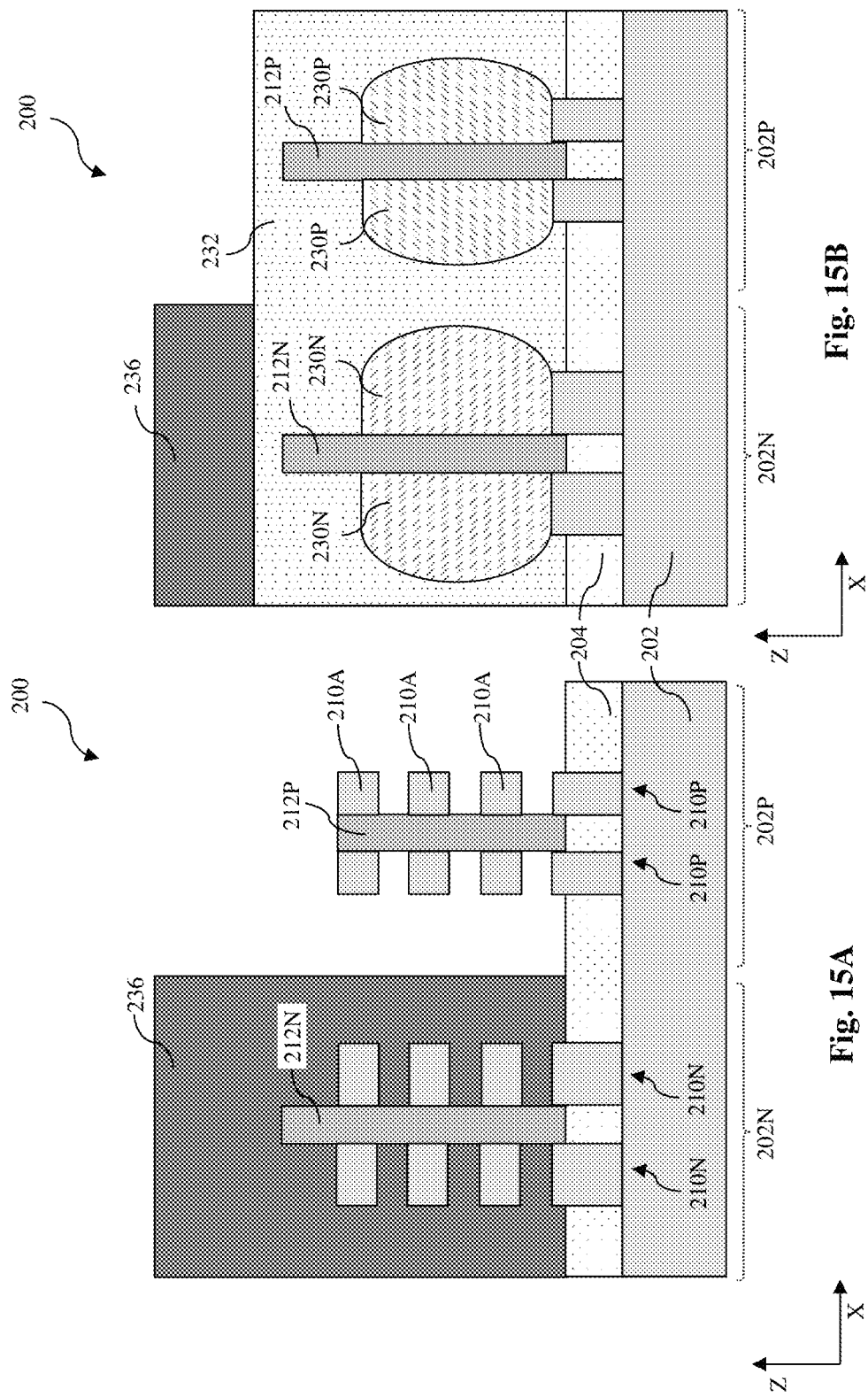

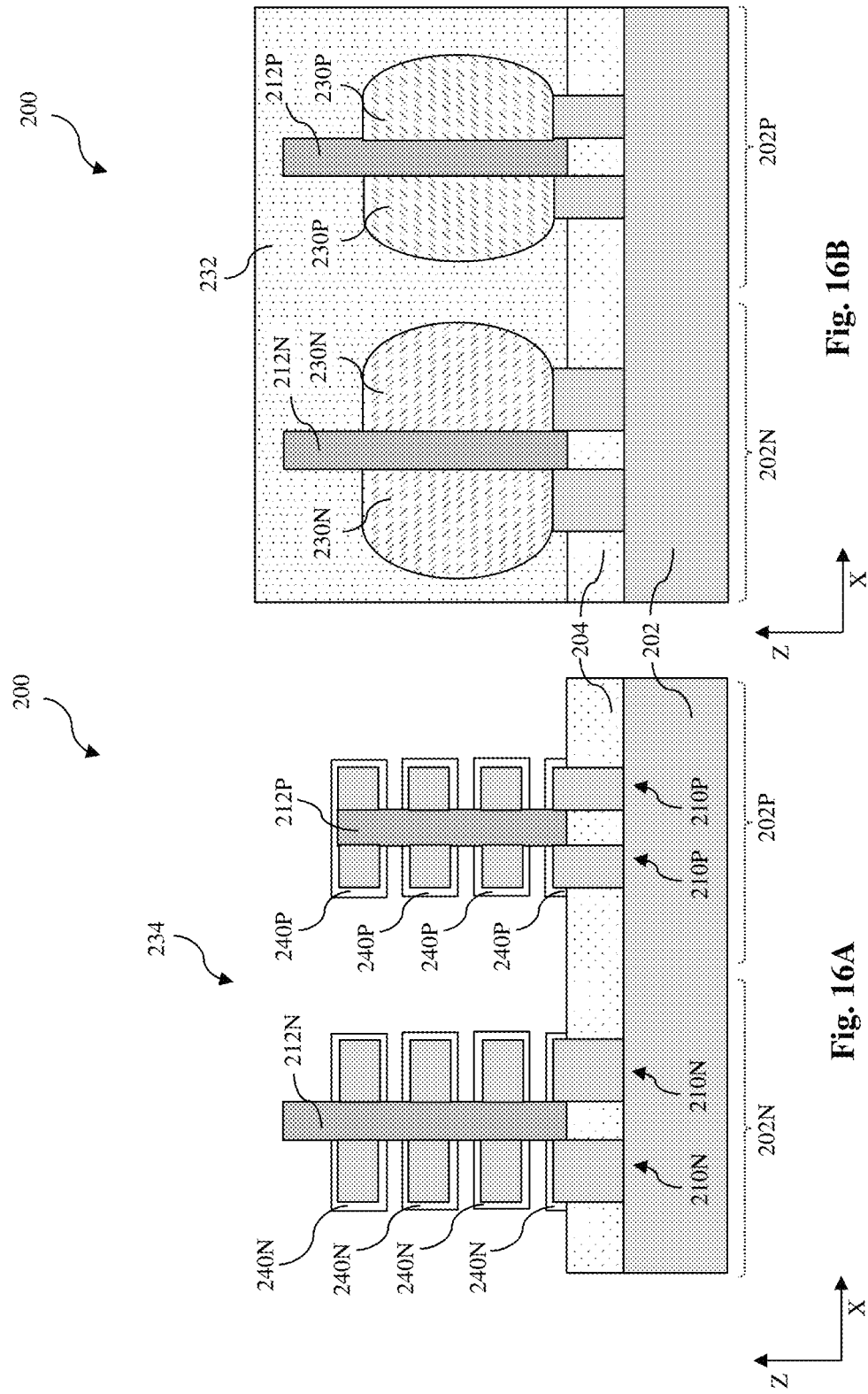

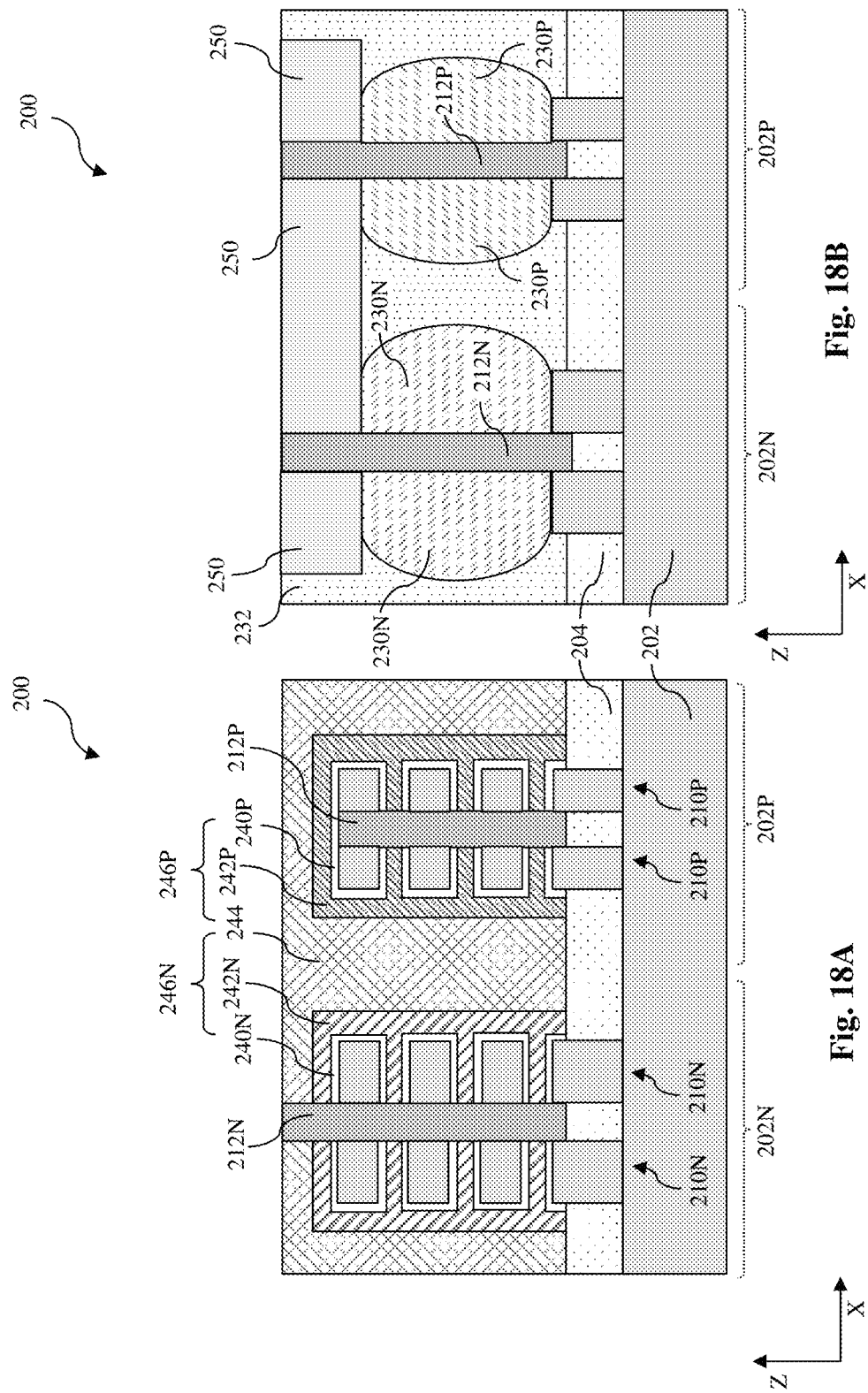

SEMICONDUCTOR DEVICE WITH FISH BONE STRUCTURE AND METHODS OF FORMING THE SAME

PRIORITY DATA

This application is a continuation application of U.S. patent application Ser. No. 16/945,928, filed Jul. 31, 2020, the entirety of which is incorporated herein by reference.

BACKGROUND

The integrated circuit (IC) industry has experienced exponential growth. Multi-gate devices have been introduced to improve device performance. One example of the multi-gate device is fin-like field effect transistor (FinFET) device. Another example of the multi-gate device is nanosheet device (also called as a nanowire device, a nanoring device, a gate-surrounding device, a gate-all-around (GAA) device, or a multi-bridge-channel device). Multi-gate devices are compatible with conventional complementary metal-oxide-semiconductor (CMOS) fabrication processes and allow aggressive scaling down of transistors.

Scaling down (for example smaller pitches and critical dimensions) is always a trend in integrated circuit (IC) fabrication. Compare with the FinFET device, even though a nanosheet device can provide better gate control performance, the minimum channel dimension of the nanosheet device is much larger than that of the FinFET device. In addition, aggressive scaling down has introduced increased complexity to the semiconductor manufacturing process and resulted in some issues of the semiconductor device. For example, the patterning window in some processes may be constrained by the limited distance between the adjacent nanosheet stacks. Therefore, improvements for the nanosheet device are needed to reduce the device size and mitigate the manufacturing issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 6A, 7A, 8A, 9A, 10A, 11A, 12A, 13A, 14A, 15A, 16A, 17A, 18A, and 19A illustrate cross-sectional views of the semiconductor device along line A-A' in the schematic diagram and the three-dimensional perspective view at intermediate stages of the method of FIG. 1 in accordance with some embodiments of the present disclosure.

FIGS. 9B, 10B, 11B, 12B, 13B, 14B, 15B, 16B, 17B, 18B, and 19B illustrate cross-sectional views of the semiconductor device along line B-B' in the schematic diagram and the three-dimensional perspective view at intermediate stages of the method of FIG. 1 in accordance with some embodiments of the present disclosure.

DETAILED DESCRIPTION

Figure 1:
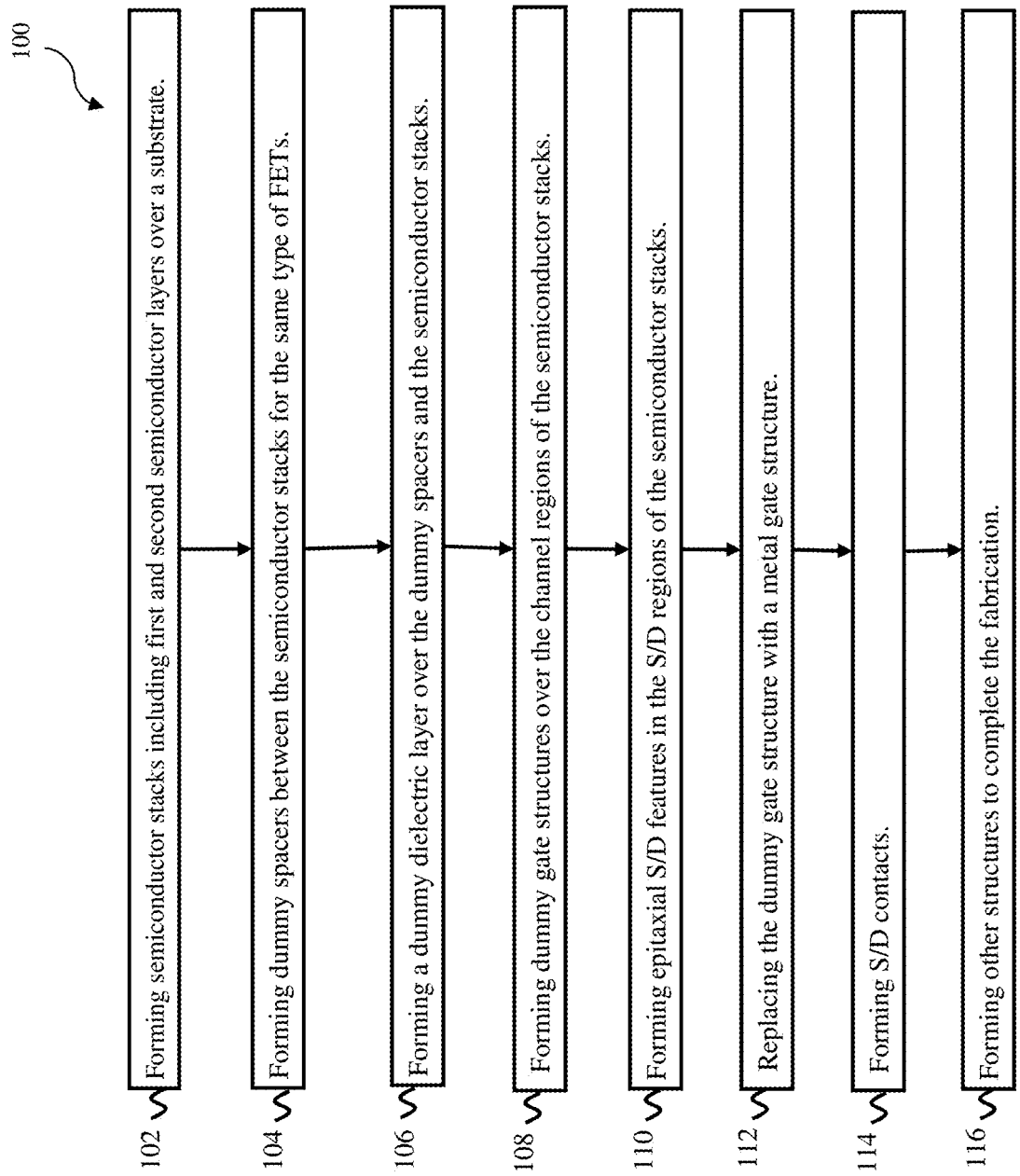
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is substantially related to semiconductor devices and the fabrication thereof, and more particularly to methods of fabricating field-effect transistors (FETs), such as nanosheet FETs.

In a nanosheet device, a channel region of a single device may comprise multiple layers of semiconductor material (also referred to as channel semiconductor layers) physically separated from one another. In some examples, a gate of the device is disposed above, alongside, and even between the semiconductor layers of the device. However, compare with FinFET, the minimum dimension in channel of the nanosheet device is around three times larger than the fin width of the FinFET. In addition, due to the aggressive scaling down of the semiconductor device, the lithography process to separate adjacent gates and epitaxial source/drain (S/D) structures may be limited by the minimum photo size constraints.

In the present disclosure, a nanosheet device with a fish bone structure is disclosed to shrink the dimension of a semiconductor device (for example, an SRAM). A dummy spacer is introduced between the adjacent same type (N-type or P-type) semiconductor layer stacks. The dummy spacer can separate the adjacent N-type or P-type metal gates and/or the adjacent N-type or P-type epitaxial S/D features to mitigate the overlay shifting issue during the fabrication. And, the distance between the same type semiconductor layer stacks is reduced and the size of the semiconductor device (for example, the cell area of the SRAM) can be effectively shrunken.

Figure 2:
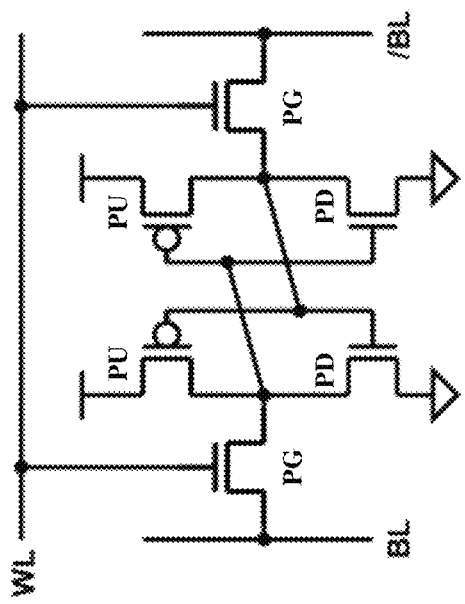
FIG. 2 illustrates a schematic diagram of an example six-transistor (6T) static random-access memory (SRAM) bit cell.
Figure 3:
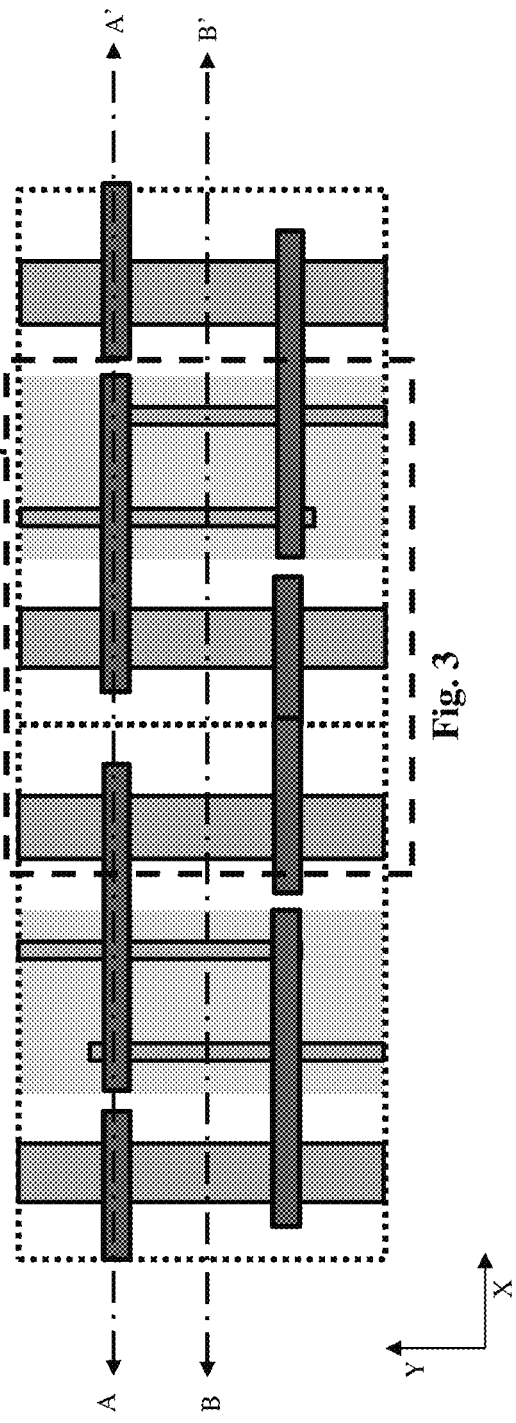
FIG. 3 illustrates a top view layout of the example six-transistor (6T) static random-access memory (SRAM) bit cell.
Figure 4:
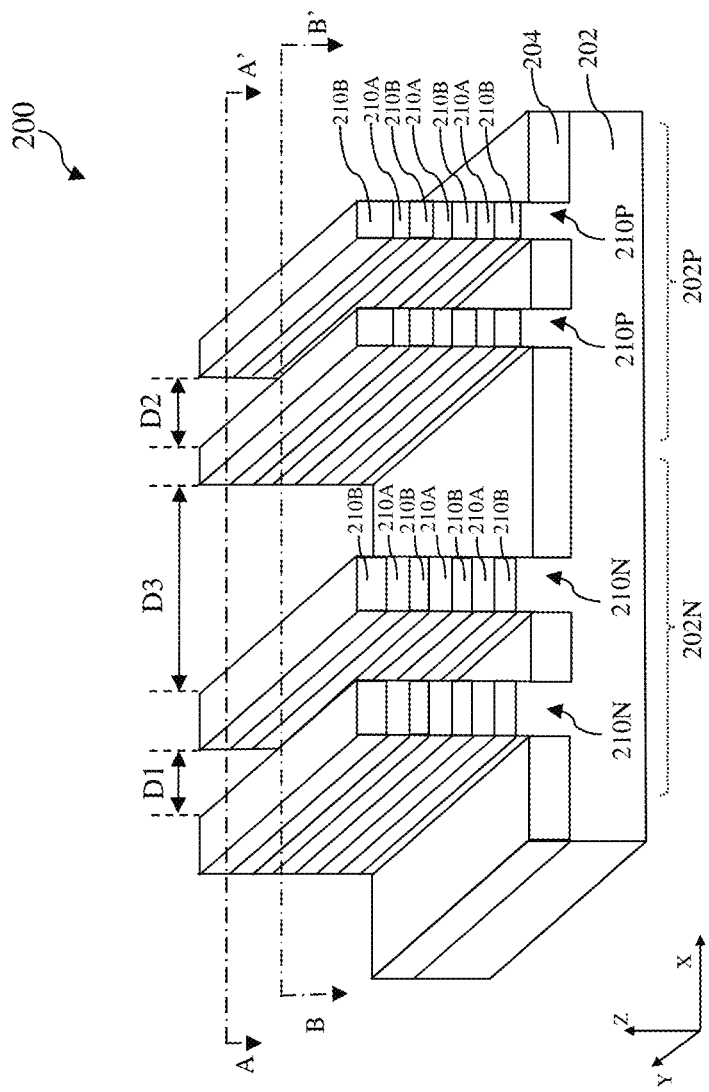
FIG. 4 illustrates a three-dimensional perspective view of the initial example semiconductor device accordance with some embodiments of the present disclosure.

FIG. 1 illustrates a flow chart of a method 100 for making an example semiconductor device 200 (hereinafter, device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of the device 200 during intermediate steps of method 100. In particular, FIG. 2 illustrates a schematic diagram of an example 6T SRAM bit cell. FIG. 3 illustrates a top view layout of the example 6T SRAM bit cell including a cell area 200. FIG. 4 is a three-dimensional view of an initial structure of the cell area 200 (hereinafter, the device 200) in accordance with some embodiments of the present disclosure. FIGS. 5A-18A illustrate cross-sectional views of the device 200 taken along the plane A-A' shown in FIGS. 3 and 4 (that is, in a gate cut X-Z plane) at intermediate stages of the method 100 in accordance with some embodiments of the present disclosure. FIGS. 9B-18B illustrate cross-sectional views of the device 200 taken along the plane B-B' shown in FIGS. 3 and 4 (that is, in a S/D cut X-Z plane) at intermediate stages of the method 100 in accordance with some embodiments of the present disclosure. It is understood that the cross-sectional views along the planes A-A' and B-B' are the same before forming the dummy gate structure (i.e. before FIGS. 9A and 9B).

As illustrated in FIG. 2, a 6T SRAM cell typically includes two P-type pull-up (PU) transistors, two N-type pull-down (PD) transistors, and two N-type pass-gate (PG) transistors. The PD transistors form cross-coupled inverters with the PU transistors. Referring to FIG. 3, the 6T SRAM layout includes a device 200 including adjacent N-type FETs (i.e. NFETs, on the left-hand side of 200) and adjacent P-type FETS (i.e. PFETs, on the right-hand side of 200). The present disclosure discloses the structure and the fabrication method of the device 200. Although the present disclosure takes a cell area (i.e. device 200) of a 6T SRAM as an example, it is understood that the device 200 may be another intermediate device fabricated during processing of an integrated circuit (IC), or a portion thereof, that may comprise logic circuits (for example, an eight-transistor (8T) SRAM, a ten-transistor (10T) SRAM, and/or other logic circuits), passive components such as resistors, capacitors, and inductors, and active components such as P-type FETs (PFETs), N-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Figure 5A:
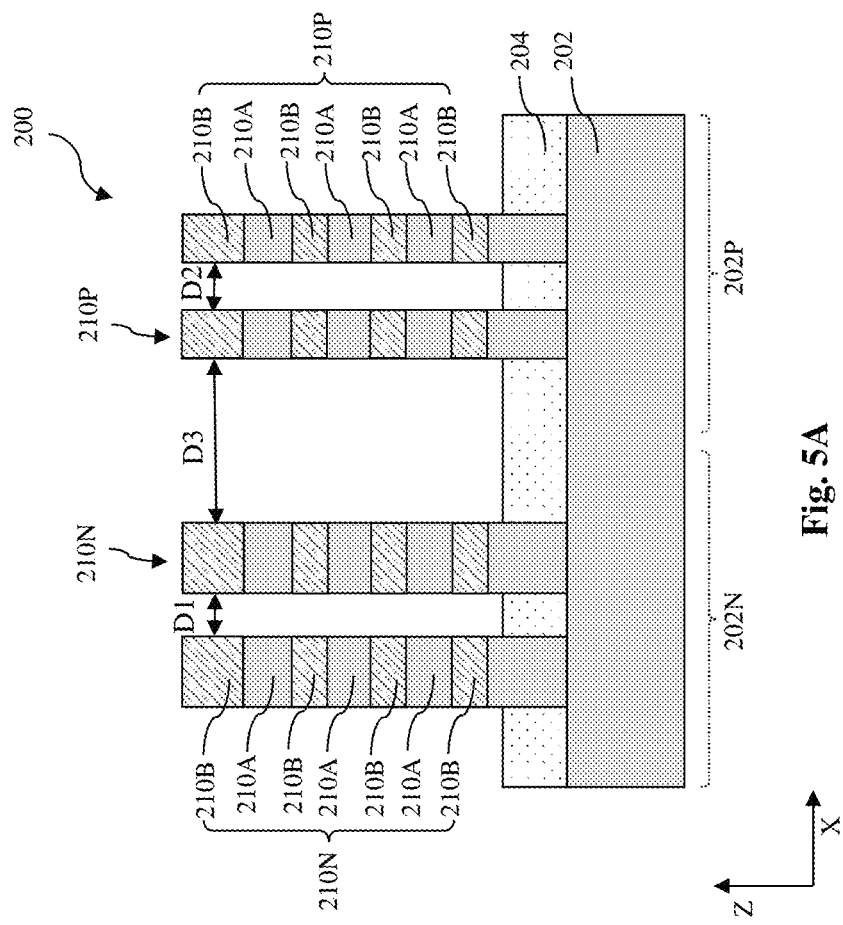

Referring to FIGS. 1, 4, and 5A, at operation 102, an initial semiconductor structure of device 200 is formed. As depicted in FIGS. 4 and 5A, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. In the depicted embodiment, the substrate 202 includes NFET region 202N comprising P-type doped substrate regions (such as p-well) doped with P-type dopants, such as boron (for example, $^{11}B$, $BF_2$), indium, other P-type dopant, or combinations thereof. The substrate 202 also includes PFET region 202P comprising N-type doped substrate regions (such as n-well) doped with N-type dopants, such as phosphorus (for example, $^{31}P$), arsenic, other N-type dopant, or combinations thereof. In some embodiments, the substrate 202 includes doped regions formed with a combination of P-type dopants and N-type dopants. An ion implantation process, a diffusion process, and/or other suitable doping process can be performed to form the various doped regions.

The device 200 includes alternating semiconductor layers formed over the substrate 202, such as semiconductor layers 210A including a first semiconductor material and semiconductor layers 210B including a second semiconductor material that is different from the first semiconductor material. The different semiconductor materials of the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, alternating SiGe/Si/SiGe/Si/ . . . layers are arranged from bottom to top. In some embodiments, the material of the top semiconductor layer may or may not be the same as the bottom semiconductor layer. In the depicted embodiments, the top semiconductor layer is a semiconductor layer 210B including SiGe. The top semiconductor layer 210B may be functioned as a hard mask layer, such that it can protect the lower semiconductor layers 210A and 210B in the following etching process(es). In some embodiments, no intentional doping is performed when forming the semiconductor layers 210A. In some other embodiments, the semiconductor layers 210A may be doped with a P-type dopant or an N-type dopant. The number of the semiconductor layers 210A and 210B depends on the design requirements of device 200. For example, it may comprise one to ten layers of semiconductor layers 210A or 210B each. In some embodiments, different semiconductor layers 210A and 210B have the same thickness in the Z-direction. In some other embodiments, different semiconductor layers 210A and 210B have different thicknesses. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, such as a metal organic CVD (MOCVD) process, and/or other suitable epitaxial growth processes.

Thereafter, the alternating semiconductor layers 210A and 210B are patterned to form semiconductor stacks 210 (hereinafter the stacks 210). In the depicted embodiment, the stacks 210 include the stacks 210N formed in the NFET region 202N and the stacks 210P formed in the PFET region 202P. In some embodiments, various photoresist lithography and etching processes may be performed to the semiconductor layers 210A and 210B to form the stacks 210 in fin-shapes as illustrated in FIGS. 4 and 5A. For example, first, a patterned photoresist mask is formed over the device 200. The patterned photoresist mask covers the fin positions according to the design requirement of device 200. Subsequently, one or more etching processes are performed using the patterned photoresist mask to remove the exposed portions of the first and second semiconductor layers 210A and 210B. The remained portions of the first and second semiconductor layers 210A and 210B form the fin-shape stacks 210. In some embodiments, a top portion of the substrate 202 is also removed. The etching process includes dry etching, wet etching, other suitable etching process, or combinations thereof. The photoresist mask is then removed using any proper method (such as a plasma ashing process).

Referring to FIGS. 4 and 5A, a distance between the adjacent stacks 210N in the NFET region 202N is D1, a distance between the adjacent stacks 210P in the PFET region 202P is D2, and the closest distance between the stacks 210N and the 210P is D3. In some embodiments, the distance D1 is about 8 nm to about 10 nm; the distance D2 is about 8 nm to about 10 nm; and the distance D3 is about 39 nm to about 42 nm. In some embodiments, the distance D3 is about 4 times to about 7 times of the distance D1 or D2. The distance D1, D2, and/or D3 cannot be too large, since the size of the device 200 may not be effectively reduced. The distance D1, D2, and/or D3 cannot be too small, otherwise it might be difficult to fill in the dummy spacer 212 between the adjacent stacks 210P in the PFET region or the adjacent stacks 210N in the NFET region, and parasitic capacitance may be increased in some instances.

Device 200 also includes an isolation structure 204 formed in the trenches between the stacks 210 to separate and isolate the active regions of device 200. In some embodiments, one or more dielectric materials, such as silicon dioxide (SiO) and/or silicon nitride (SiN), is deposited over the substrate 202 along sidewalls of the stack 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 204.

Figure 6A:
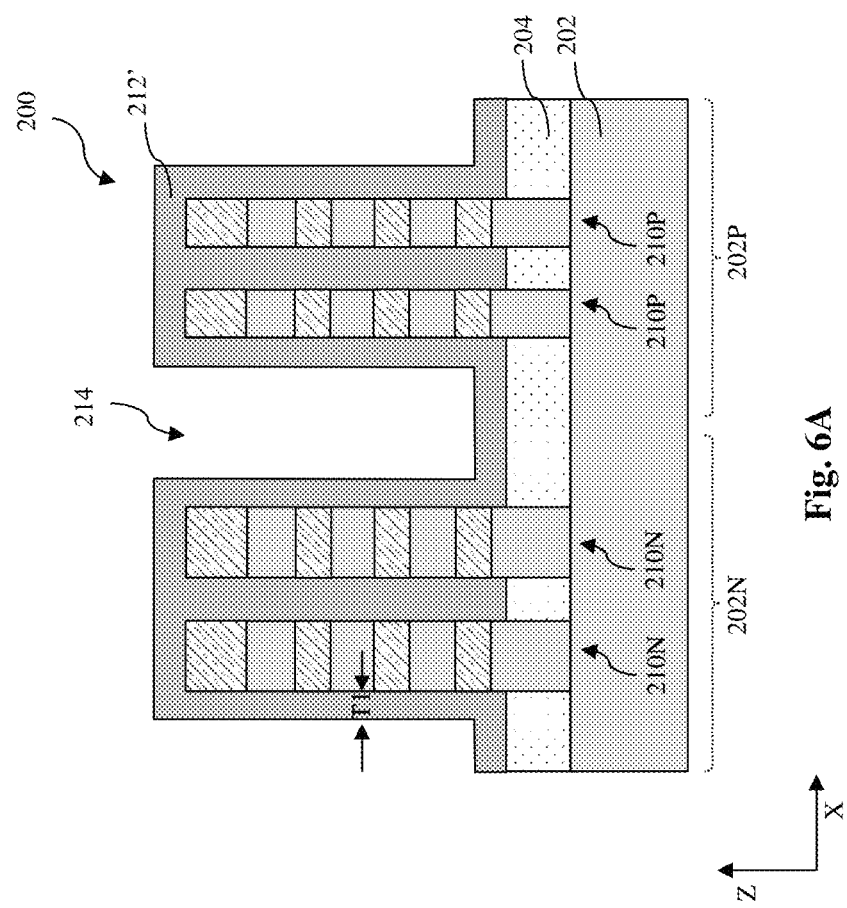
Figure 7A:
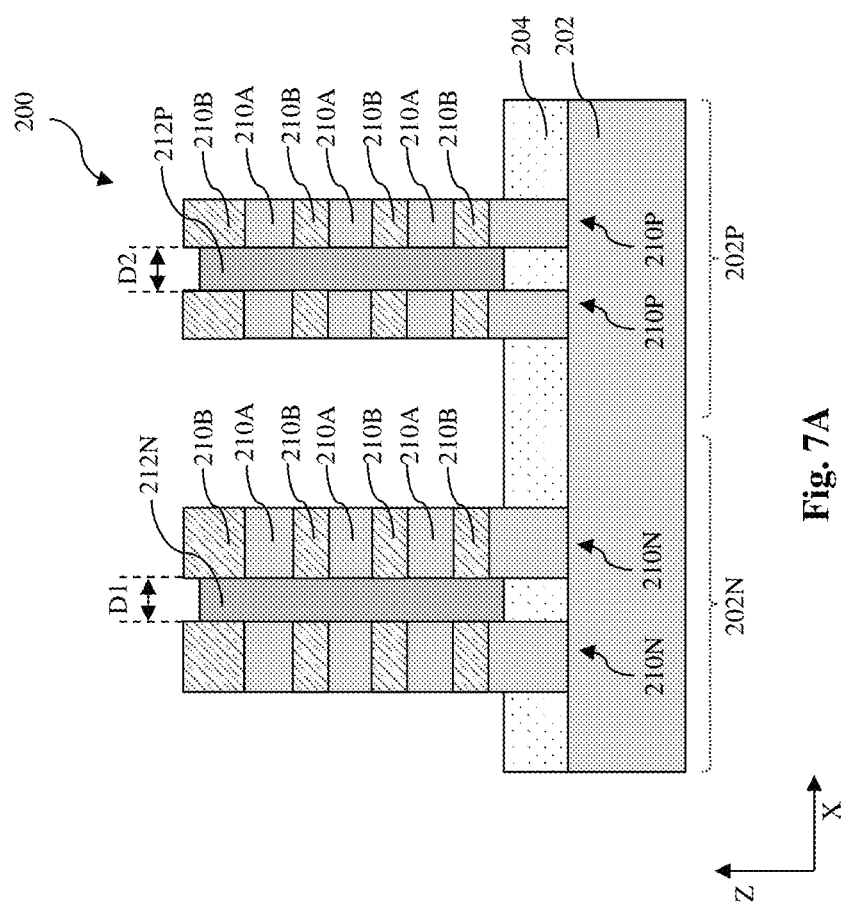

Referring to FIGS. 1, 6A, and 7A, at operation 104, dummy spacers 212N and 212P (both referred to as dummy spacers 212) are formed between the adjacent stacks 210N in the NFET region 202N, or between the adjacent stacks 210P in the PFET region 202P. In other words, the dummy spacers 212 are formed between the stacks 210 of the same type (N-type or P-type) FETs. Referring to FIG. 6A, a dummy spacer layer 212' is deposited over the stacks 210 and the isolation structure 204. In some embodiments, the dummy spacer layer includes either a nitride based dielectric material (for example, silicon nitride (SiN), silicon carbonitride (SiCN), other nitride based dielectric material, or a combination thereof) or an oxide based dielectric material (for example, silicon oxide (SiO), silicon oxycarbide (SiOC), other oxide based dielectric material, or a combination thereof). In some embodiments, the dummy spacer layer 212' is formed by a deposition process, such as atomic layer deposition (ALD), CVD, PVD, other deposition process, or a combination thereof. The deposition process is controlled such that the gap between the stacks 210N in the NFET region 202N and the gap between the stacks 210P in the PFET region 202P are filled up, while the gap between the adjacent stacks 210 for different FETs (i.e. the adjacent stacks 210N and 210P) are not filled up and a trench 214 is formed therebetween. Referring to FIG. 6A, a thickness T1 of the dummy spacer layer 212' is substantially equal or greater than half (50%) of the distance D1 between the stacks 210N and/or the distance D2 between the stacks 210P. D1 or D2 is substantially equal or less than double (200%) of the thickness T1. In the depicted embodiment where the distance D1 or D2 is about 8 nm to about 10 nm, the thickness T1 is about 4 nm to about 6 nm, such that the dielectric material of the dummy spacer layer can fill up the gap between the stacks 210N or the gap between the stacks 210P.

Thereafter, referring to FIG. 7A, outside portion of the dummy gate spacer layer 212' is removed, while the inside portions between the adjacent stacks 210N or between the adjacent stacks 210P are remained. In some embodiments, the outside portion of the dummy gate spacer layer 212' is removed by an isotropic etching process, such as dry etching, wet etching, or a combination thereof. The remained inside portions of the dummy gate spacer layer 212' form the dummy spacer 212N between the stacks 210N and the dummy spacer 212P between the stacks 210P. In some embodiments, top portions of the dummy gate spacers 212 may also be removed during the etching process. The top surfaces of the dummy spacers 212 are below the top surfaces of the top semiconductor layers 210B and are above or substantially coplanar with the top surfaces of the top semiconductor layers 210A. That is, the etching process is controlled such that the removed extent of the top portions of the dummy gate spacers 212 is less than the thickness of the top semiconductor layers 210B (which are used as hard masks during etching process), while the outside portion of the dummy gate spacer layer 212' is removed substantially completely. As depicted in FIG. 7A, the stacks 210 of the same type FETs, i.e. the adjacent stacks 210N or the adjacent stacks 210P, are separated by the dummy spacers 212N or 212P, respectively. The dummy spacer 212N contacting sidewalls of the semiconductor layers 210A and 210B of the stacks 210N has a width D1 in the X-direction and the dummy spacer 212P contacting sidewalls of the semiconductor layers 210A and 210B of the stacks 210P has a width D2 in the X-direction.

Figure 8A:
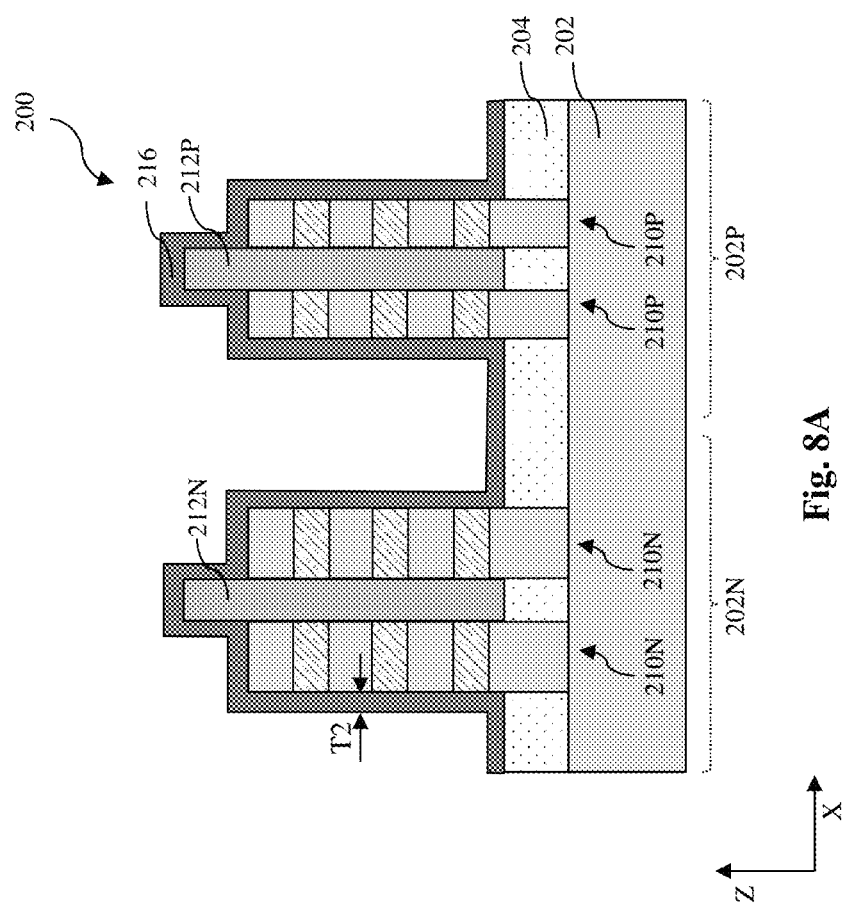

Now referring to FIGS. 1 and 8A, at operation 106, a dummy dielectric layer 216 is formed over the substrate 202. Before forming the dummy dielectric layer 216, the top semiconductor layer 210B is removed from the top of the stacks 210. In some embodiments, the top semiconductor layer 210B may be removed by a selective etching process, since the material of the top semiconductor layer 210B can provide different oxidation rate and/or etching selectivity than that of the below semiconductor layer 210A. The selective etching process may be dry etching, wet etching, or a combination thereof.

Thereafter, the dummy dielectric layer 216 is deposited over the stacks 210, the dummy spacers 212, and the isolation structure 204. The dummy dielectric layer 216 can protect the dummy spacer and/or the semiconductor layers 210A and 210B during the following gate replacement process. A material of the dummy dielectric layer 216 should provide an etching selectivity than that of the dummy spacers 212. For example, if the dummy spacer 212 includes a nitride based dielectric material, the dummy dielectric layer 216 includes an oxide based dielectric material; or, if the dummy spacer 212 includes an oxide based dielectric material, the dummy dielectric layer 216 includes a nitride based dielectric material. In some embodiments, the dielectric material may include SiN, SiCN, SiO, SiOC, other suitable dielectric material, or a combination thereof. In some embodiments, the dummy dielectric layer 216 is formed by ALD, CVD, PVD, other deposition process, or a combination thereof. As depicted in FIG. 8, the dummy dielectric layer 216 has a thickness of T2. In some embodiments, the thickness T2 is about 3 nm to about 10 nm, such that the dummy dielectric layer 216 is thick enough to protect the dummy spacers 212 and the stacks 210, and is thin enough such that the time and cost to form the layer as well as remove the layer in the later process(es) will not be increased.

Referring to FIGS. 1, 9A and 9B, at operation 108, dummy gate structures 220 are then formed over the stacks 210. Each dummy gate structure 220 serves as a placeholder for subsequently forming a metal gate structure. In some embodiments, the dummy gate structures 220 extend along the X-direction and traverse respective stacks 210. The dummy gate structures 220 cover the channel regions of the stacks 210 which interpose the source regions and the drain regions (both referred to as the S/D regions). Each of the dummy gate structures 220 may include various dummy gate layers, for example, an interfacial layer over the stacks 210, a dummy gate electrode (for example, including polysilicon) over the interfacial layer, one or more hard mask layers over the dummy gate electrode, and/or other suitable layers. The dummy gate structures 220 are formed by deposition processes, lithography processes, etching processes, other suitable processes, or combinations thereof. For example, different dummy gate layers are deposited over the stacks 210. A lithography process is then performed to form a mask covering the channel regions of the stacks 210. Thereafter, the different dummy gate layers are etched using the lithography mask to form the dummy gate structures 220. The lithography mask is then removed using any proper method. In some embodiments, gate spacers (not shown) comprising a dielectric material may be formed along sidewalls of the dummy gate structures 220 and is considered a portion of the dummy gate structures 220.

Referring to FIGS. 1, 10A, 10B, 11A and 11B, at operation 110, epitaxial S/D features 230N and 230P (both referred to as the epitaxial S/D features 230) are formed over the S/D regions of the stacks 210. Referring to FIGS. 10A and 10B, first, the dummy dielectric layer 216 and the stacks 210 in the S/D regions are removed by etching process(es). In some embodiments, the dummy dielectric layer 216 and the stacks 210 are removed along sidewalls of the dummy gate structure 220 to form the S/D trenches 224 in FIG. 10B. In some embodiments, the dummy dielectric layer 216 is removed before removing the stacks 210. Since the materials of the dummy dielectric layer 216 and the dummy spacers 212 can provide different etching selectivities, the dummy spacers 212 are substantially unaffected when removing the dummy dielectric layer 216. Then, a S/D etching process is followed to remove the portions of the stacks 210 over the S/D regions. The etching process(es) may be dry etching (such as reactive ion etching (ME)), wet etching, or a combination thereof. The duration of the etching process(es) is controlled such that the portion of each semiconductor layers 210A and 210B in the S/D regions are removed, i.e. the sidewalls of each semiconductor layers 210A and 210B are exposed in the S/D trenches 224. In some embodiments, inner spacers (not shown) may then be formed along the edge portions of the semiconductor layers 210B.

Figures 11A, 11B:
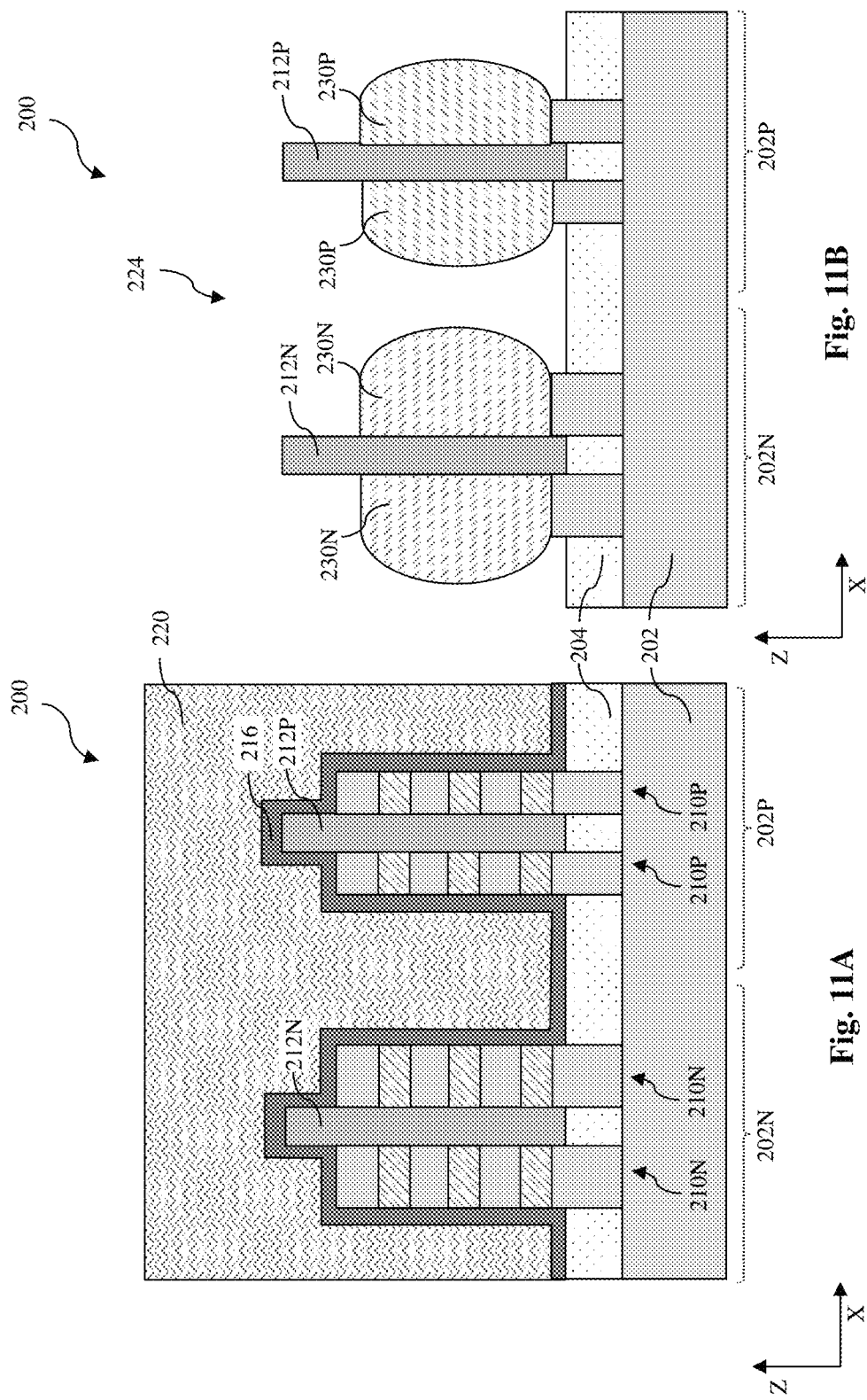

Thereafter, referring to FIGS. 11A and 11B, the S/D features 230N and 230P are epitaxially grown in the S/D trench 224 over the NFET region 202N and the PFET region 202P, respectively. The epitaxial S/D features may comprise different semiconductor materials for different type (N-type or P-type) S/D features. For example, in the NFET region 202N, the N-type epitaxial S/D features 230N may include materials such as silicon and/or carbon, where the silicon-containing epitaxial layers or silicon-carbon-containing epitaxial layers are doped with phosphorous, arsenic, other N-type dopant, or combinations thereof (for example, forming an Si:P epitaxial layer, an Si:C epitaxial layer, or an Si:C:P epitaxial layer). In the PFET region 202P, the P-type epitaxial S/D features 230P may include materials such as silicon and/or germanium, where the silicon-germanium-containing epitaxial layers are doped with boron, carbon, other P-type dopant, or combinations thereof (for example, forming an Si:Ge:B epitaxial layer or an Si:Ge:C epitaxial layer). In some embodiments, the S/D features 230 include more than one crystalline layers formed one over another. In some embodiments, the epitaxial S/D features 230 include materials and/or dopants that achieve desired tensile stress and/or compressive stress in the channel regions. In various embodiments, different epitaxial layer(s) of the epitaxial S/D features 230 may include same or different semiconductor materials.

An epitaxy process is implemented to grow the S/D features 230 in the S/D trench 224. The epitaxy process includes CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. Referring to FIG. 11B, due to the dummy spacers 212, the adjacent S/D features 230 of the same type FETs, i.e. the adjacent N-type S/D features 230N in the NFET region 202N or the adjacent P-type S/D features 230P in the PFET region 202P, are not merged in the X-direction. That is, the dummy spacers 212 separate the adjacent S/D features 230 of the same type FETs.

In a conventional nanosheet semiconductor device, to separate the adjacent same type S/D features, the semiconductor stacks need a certain distance. However, in the present disclosure, the same type S/D features are separated by the dummy spacer. Thus, the distance between the same semiconductor stacks are reduced to a distance D1 or D2, i.e. the width of the dummy spacers 212N or 212P. In some embodiments, the distance between the same type semiconductor stacks in the present disclosure may be reduce to about 20% to about 40% of that in a conventional nanosheet semiconductor device. Thus, the device size is aggressively reduced. In addition, the dummy spacer between the same type S/D features can be used to separate the S/D contact (see, FIGS. 18B and 19B), thus can mitigate the overlay shifting issue when forming the S/D contacts.

Figures 12A, 12B:
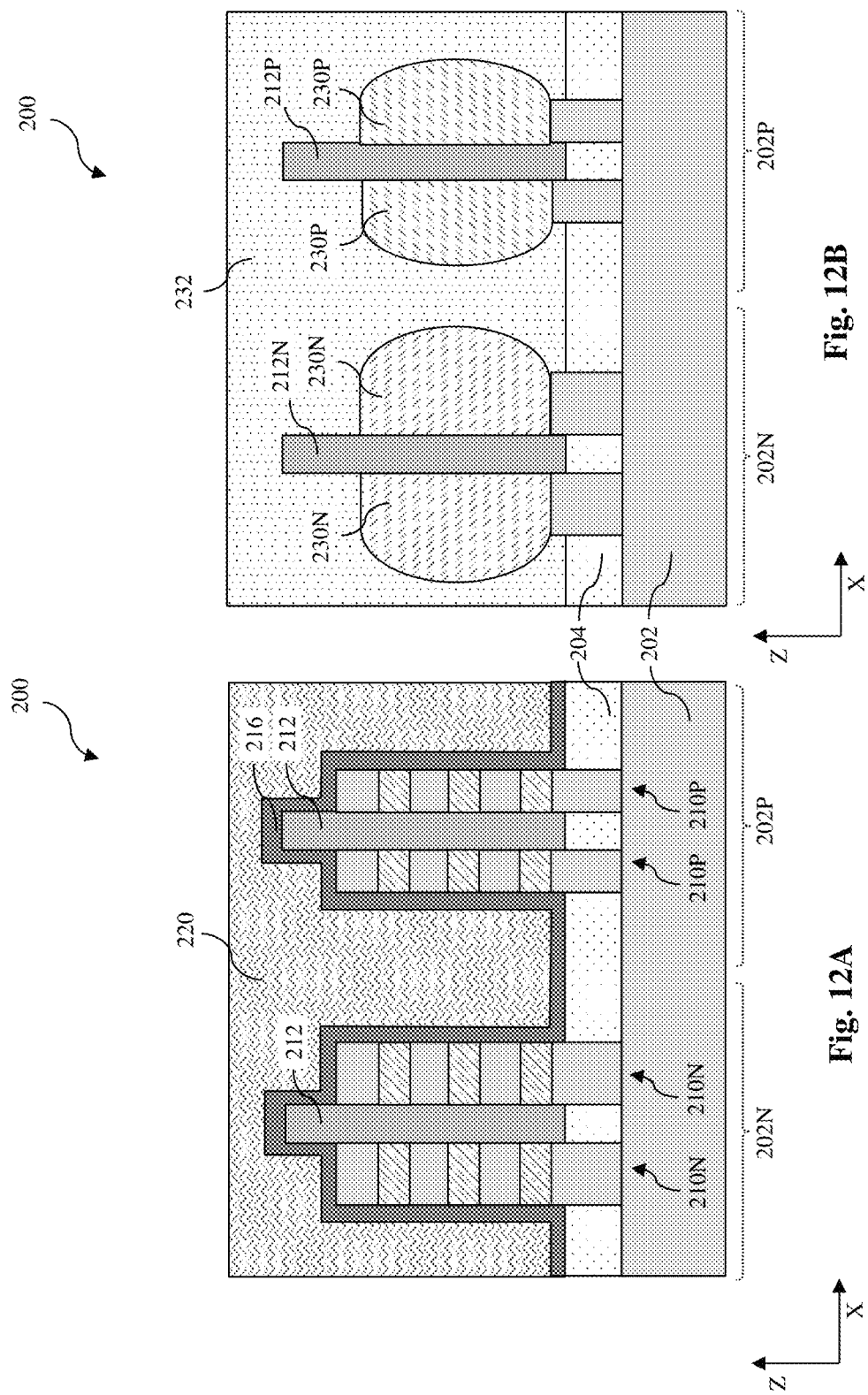

Thereafter, referring to FIGS. 1, 12A-17A, and 12B-17B, at operation 112, a gate replacement process is performed to replace the dummy gate structure 220 with a metal gate structure 244. Referring to FIGS. 12A and 12B, an interlayer dielectric (ILD) layer 232 is formed over the epitaxial S/D features 230, the dummy spacers 212, and the isolation structure 204 in the S/D region. The ILD layer 232 includes a dielectric material different than the dummy spacers 212. In some embodiments, the ILD layer 232 includes a low-k (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 232 may be formed by a deposition process such as CVD, flowable CVD (FCVD), spin-on-glass (SOG), other suitable methods, or combinations thereof. Subsequently, a planarization process (for example, a CMP) may be performed to remove the top portion of the device 200 (for example, a top portion of the ILD layer 232 and the hard mask layer(s) of the dummy gate structure 220) to expose the dummy gate electrode. Referring to FIG. 12B, the remained ILD layer 232 covers the dummy spacers 212 in the S/D regions, such that the dummy spacers 212 in the S/D regions are protected in the later dummy spacer etch back process.

Referring to FIGS. 13A and 13B, the dummy gate structure 220 is removed to form a gate trench 234 exposing the channel regions of the stacks 210. In some embodiments, removing the dummy gate structure 220 comprises one or more etching processes, such as wet etching, dry etching, or a combination thereof. Sidewalls of the semiconductor layers 210A and 210B facing away from the dummy spacers 212 are exposed in the gate trench 234.

Subsequently, referring to FIGS. 14A and 14B, the semiconductor layers 210B are selectively removed from the gate trench 234. Due to the different oxidation rates and/or etching selectivities of the materials of the semiconductor layers 210A (for example, SiGe) and 210B (for example, Si), only semiconductor layers 210B are removed, while the semiconductor layers 210A remain substantially unchanged. In some embodiments, the selective removal of the semiconductor layers 210B may include an oxidation process followed by a selective etching process. For example, the semiconductor layers 210B are first selectively oxidized to include a material of SiGeOx. Then, a selective etching process is performed to remove the SiGeOx with a suitable etchant such as ammonium hydroxide (NH4OH) or hydro fluoride (HF). In some embodiments, the semiconductor layers 210A are slightly etched or not etched during the selective etching process. Thereby, the semiconductor layers 210A are suspended in the channel regions and stacked up along the direction (Z-direction) substantially perpendicular to the top surface of the substrate 202 (X-Y plane). The suspended semiconductor layers 210A are also referred to as channel semiconductor layers 210A. Referring to FIG. 14A, the channel semiconductor layers 210A of the same type FETs and the dummy spacer 212 therebetween form a fish bone structure in the X-Z plane. That is, the channel semiconductor layers 210A of the stacks 210N and the dummy spacer 212N form a fish bone structure in the NFET region 202N and the channel semiconductor layers 210A of the stacks 210P and the dummy spacer 212P form a fish bone structure in the PFET region 202P. While a sidewall of the channel semiconductor layers 210A contacts the dummy spacers 212N or 212P, the other sides (including the top surface, the bottom surface, and another sidewall) of the channel semiconductor layers 210A are exposed in the gate trench 234.

Referring to FIGS. 3, 15A and 15B, the gate structures of device 200 are disconnected in the NFET region and is continuous in the PFET region along line A-A', a top portion of the dummy spacer 212P in the channel region is etched back (i.e. dummy spacer etch back). For example, a photoresist mask 236 may be formed to cover the NFET region 202N. A top portion of the dummy spacer 212P between the stacks 210P (in the channel region) is removed by an etching process, such as wet etching, dry etching, or a combination thereof. Due to the protection by the ILD layer 232, the dummy spacer 212P between the epitaxial S/D features 230P (in the S/D region) is not affected. As depicted in FIGS. 15A and 15B, the top surface of the dummy spacer 212P between the stacks 210P is substantially coplanar with the top surface of the top channel semiconductor layer 210A. In the depicted embodiment, the top surface of the dummy spacer 212P in the channel region is below the top surface of the dummy spacer 212P in the S/D region, while the top surface of the dummy spacer 212N in the channel region is substantially coplanar with the top surface of the dummy spacer 212N in the S/D region.

Thereafter, referring to FIGS. 16A, 16B, 17A, and 17B, metal gate structures 246N and 246P (both referred to as metal gate structures 246) are formed in the channel region of the stacks 210. The metal gate structures 246 wrap around the exposed sides of each suspended channel semiconductor layer 210A. In some embodiments, each of the metal gate structures 246N and 246P comprises a gate dielectric layer, a metal gate electrode, and other suitable layers. Referring to FIGS. 16A and 16B, gate dielectric layers 240N and 240P (both referred to as gate dielectric layers 240) are deposited to wrap the exposed sides of the channel semiconductor layers 210A in the gate trench 234. Specifically, the exposed sides include a sidewall facing away from the dummy spacer 212, a top surface, and a bottom surface of the channel semiconductor layers 210A. In some embodiments, the gate dielectric layers 240 includes a high-k (K>3.9) dielectric material, such as HfO2, HfSiO, HfSiO4, HfSiON, HfLaO, HfTaO, HfSiO, HfZrO, HfAlOx, ZrO, ZrO2, ZrSiO2, AlO, AlSiO, Al$_2$O$_3$, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material, or combinations thereof. The gate dielectric layers 240 may be deposited by CVD, PVD, ALD, and/or other suitable method. Referring to FIG. 16A, a top surface of the gate dielectric layer 240N is below a top surface of the dummy spacer 212N and a top surface of the gate dielectric layer 240P is above a top surface of the dummy spacer 212P. That is, the top portion of the gate dielectric layer 240N is separated by the dummy spacer 212N and the top portion of the gate dielectric layer 240P extends continuously over the top surface of the dummy spacer 212P.

Figures 17A, 17B:
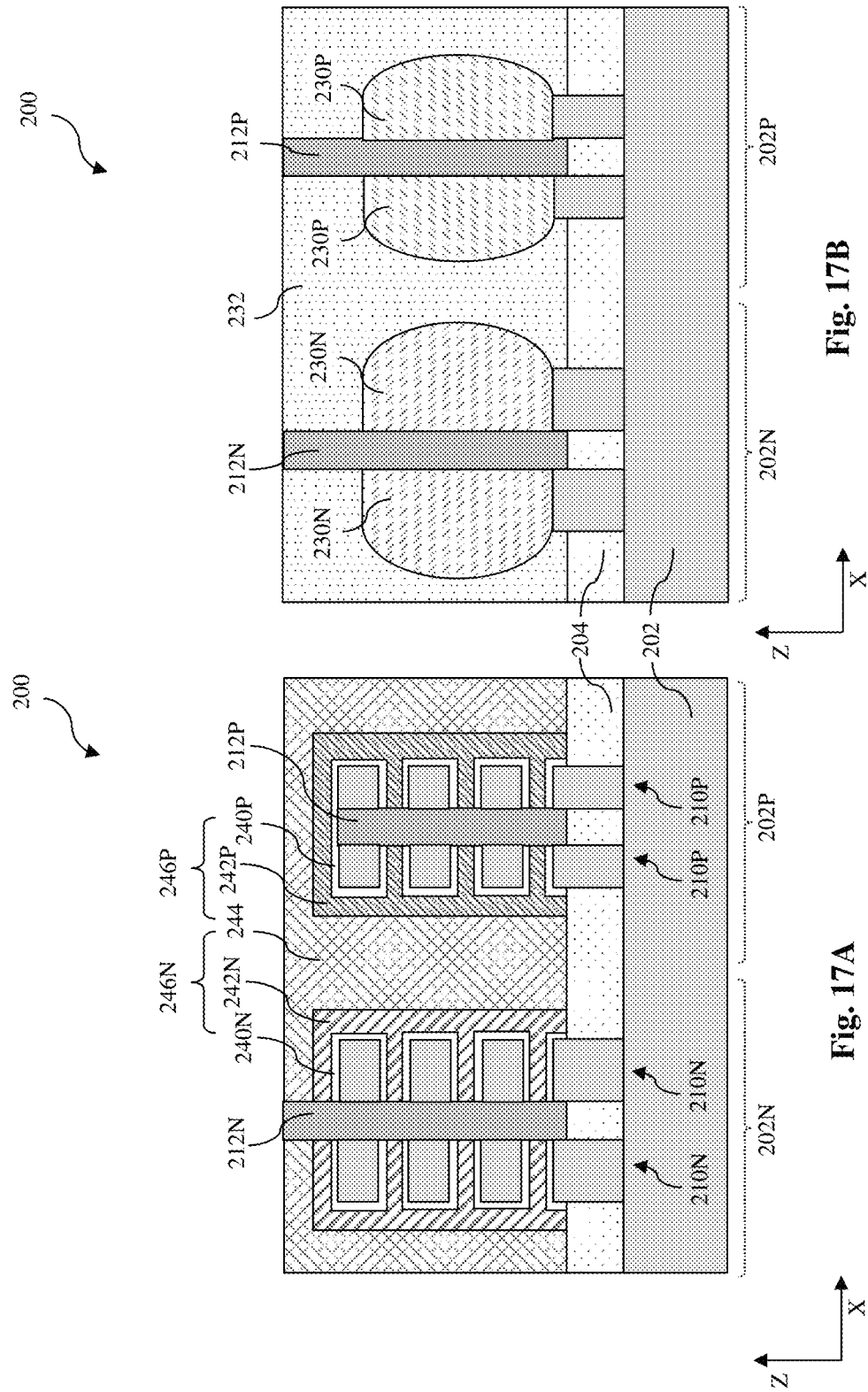

Referring to FIGS. 17A and 17B, the gate electrodes are formed over the gate dielectric layers 240N and 240P. Each of the gate electrodes includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. Referring to FIG. 17A, the work function metal (WFM) 242N and WFM 242P (both referred to as WFMs 242) are formed over the gate dielectric layers 240N and 240P, respectively. In some embodiments, the material of the WFM layer may include TiAl, TiAlC, TaAlC, TiAlN, TiN, TSN, TaN, WCN, Mo, other materials, or combinations thereof. The WFMs 240 can be formed by any suitable method, such as CVD, ALD, PVD, plating, chemical oxidation, thermal oxidation, other suitable methods, or combinations thereof. As depicted in FIG. 17A, the WFMs 240 wrap the exposed sides of the channel semiconductor layers 210A. A top surface of the WFM 240N is below a top surface of the dummy spacer 212N, while a top surface of the WFM 240P is above a top surface of the dummy spacer 212P. That is, the top portion of the WFM 242N is separated by the dummy spacer 212N and the top portion of the WFM 240P extends continuously over the top surface of the dummy spacer 212P.

Thereafter, the bulk metal 244, for example including Al, W, Cu, or combinations thereof, is formed in the gate trench 234 over the WFMs 242. In some embodiments, the bulk metal 244 is formed by any suitable method, such as CVD, ALD, PVD, plating, chemical oxidation, thermal oxidation, other suitable methods, or combinations thereof. In the depicted embodiment, the gate dielectric layer 240N, the WFM 242N, and the bulk metal 244 form the metal gate structure 246N, and the gate dielectric layer 240P, the WFM 242P, and the bulk metal 244 form the metal gate structure 246P. A planarization process (for example, CMP) is then performed to remove the excess bulk metal material such that the top surface of the dummy spacer 212N is exposed. Thereby, the top portion of the metal gate structure 246N is separated by the dummy spacer 212N, while the top portion of the metal gate structure 246P extends continuously over the dummy spacer 212P. Referring to FIG. 17B, the top portion of the ILD layer 232 is also removed by the planarization process, and the top surfaces of the dummy spacers 212N and 212P in the S/D regions are also exposed.

Now referring to FIGS. 1, 18A and 18B, at operation 114, S/D contacts 250 are formed over the epitaxial S/D features 230. In some embodiments, the S/D contacts 250 include a conductive material such as Al, W, Cu, or combinations thereof. The S/D contacts 250 may be formed by various processes including lithography process, etching process, and/or deposition process. For example, a photoresist mask is formed to expose the portion of the ILD layer 232 in the S/D contact positions. An etching process is then performed to remove the exposed portion of the ILD layer 232. Since the material of the ILD layer 232 is different than that of the dummy spacers 212, the dummy spacers 212 are substantially unchanged during the etching process. The conductive material of the S/D contacts 250 are then formed to replace the removed portions of the ILD layer 232. The dummy spacers 212 are used to separate the S/D contacts 250.

Figures 19A, 19B:
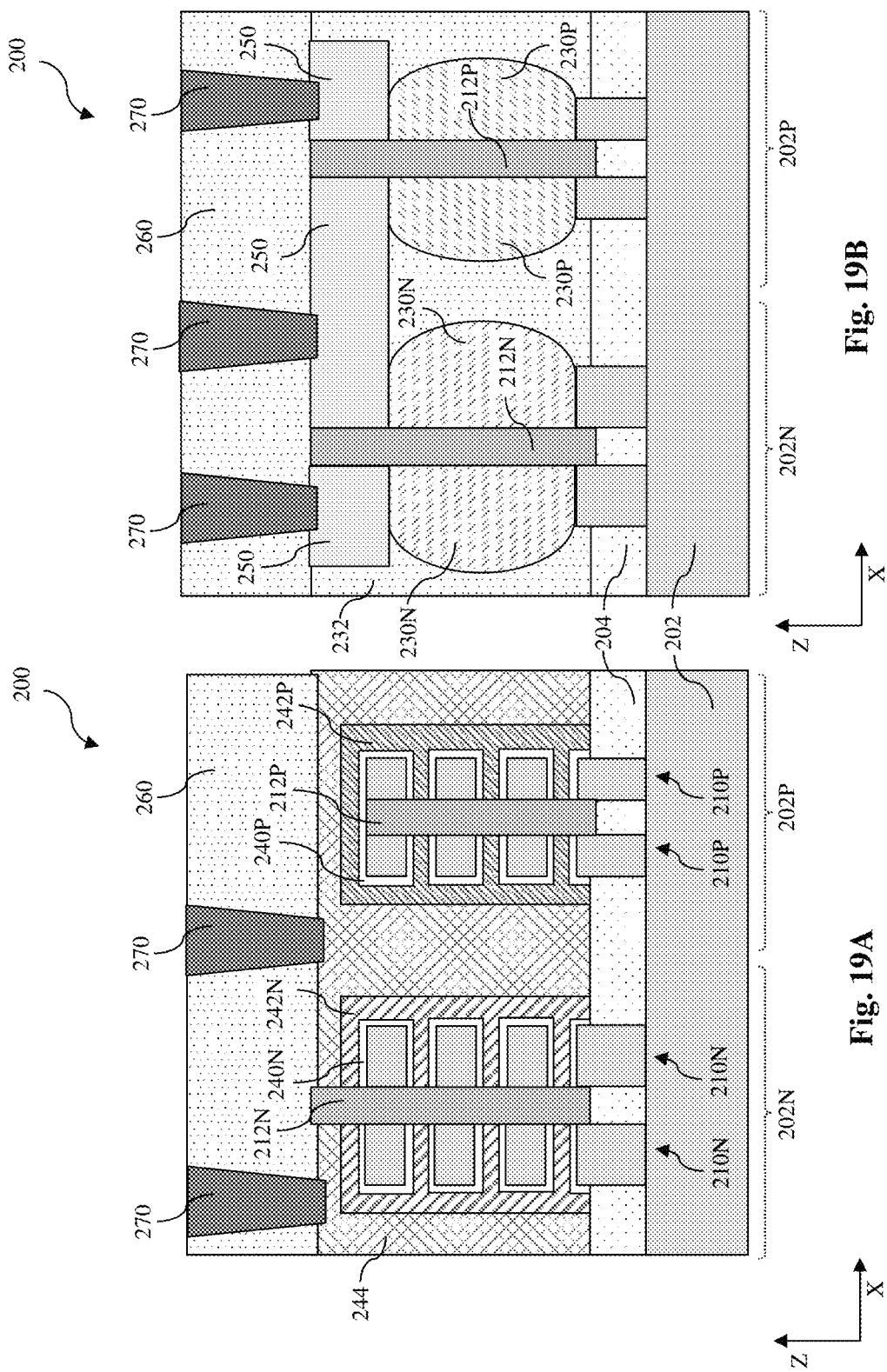

Now, referring to FIGS. 1, 19A and 19B, at operation 116, further processing is performed to complete the fabrication of the device 200. For example, other multilayer interconnect features, such as metal lines/contacts/vias 270, as well as ILD layers 260 and/or etch stop layer are formed over the device 200, configured to connect the various features to form a functional circuit that comprises the different semiconductor devices.

Compare with a conventional nanosheet semiconductor device, where no dummy spacer to separate the same type of FETs, the nanosheet semiconductor device in the present disclosure has a much smaller size because the dummy spacer separates as well as reduces the distance between the same type semiconductor stacks. In addition, the dummy spacer can also effectively separate the same type epitaxial S/D features and can be used to separate the metal gate structures according to the design requirements of the semiconductor device. Therefore, the overlay shifting issue of the lithography process can be mitigated, while the device size can be effectively reduced.

Although not intended to be limiting, one or more embodiments of the present disclosure provide many benefits to a semiconductor device and a formation process thereof. For example, embodiments of the present disclosure provide a semiconductor device with a dummy spacer formed between the channel semiconductor layers for the same type FETs. The channel semiconductor layers and the dummy spacer form a fish-bone structure to reduce the device size, separate the epitaxial S/D features and/or the metal gate structures, as well as mitigate the overlay shifting issues during the fabrication.

The present disclosure provides for many different embodiments. Semiconductor device having fish bone structure and methods of fabrication thereof are disclosed herein. An exemplary semiconductor device comprises a first semiconductor stack and a second semiconductor stack over a substrate, wherein each of the first and second semiconductor stacks includes semiconductor layers stacked up and separated from each other; a dummy spacer between the first and second semiconductor stacks, wherein the dummy spacer contacts a first sidewall of each semiconductor layer of the first and second semiconductor stacks; and a gate structure wrapping a second sidewall, a top surface, and a bottom surface of each semiconductor layer of the first and second semiconductor stacks.

In some embodiments, the exemplary semiconductor device further comprises epitaxial source/drain (S/D) features contacting sidewalls of the dummy spacer. In some embodiments, the exemplary semiconductor device further comprises S/D contacts over the epitaxial S/D features and contacting sidewalls of the dummy spacer. In some embodiments, the exemplary semiconductor device further comprises an isolation structure isolating active regions of the semiconductor device and contacting a bottom surface of the dummy spacer. In some embodiments, a top surface of the dummy spacer is above top surfaces of top semiconductor layers of the first and second semiconductor stacks and the dummy spacer separates the gate structure including a gate dielectric layer and a gate electrode over the gate dielectric layer. In some embodiments, the gate structure includes a gate dielectric layer and a gate electrode over the gate dielectric layer, the gate dielectric layer and the gate electrode extends continuously over a top surface of the dummy spacer. In some embodiments, a width of the dummy spacer is about 8 nm to about 10 nm.

Another exemplary semiconductor device comprises first semiconductor stacks over a first region of a substrate, second semiconductor stacks over a second region of the substrate, wherein each of the first and second semiconductor stacks includes semiconductor layers stacked up and separated from each other; a first dummy spacer between the first semiconductor stacks and a second dummy spacer between the second semiconductor stacks, wherein the first dummy spacer contacts sidewalls of the semiconductor layers of the first semiconductor stacks, and the second dummy spacer contacts sidewalls of the semiconductor layers of the second semiconductor stacks; and a first gate structure wrapping each semiconductor layer of the first semiconductor stacks and a second gate structure wrapping each semiconductor layer of the second semiconductor stacks, wherein a top portion of the first gate structure is separated by the first dummy spacer and a top portion of the second gate structure extends continuously over a top surface of the second dummy spacer.

In some embodiments, a top surface of the second dummy spacer in a channel region is below a top surface of the second dummy spacer in a source/drain region. In some embodiments, a closest distance between the first semiconductor stacks and the second semiconductor stacks is about 4 times to about 7 times of a width of the first dummy spacer or a width of the second dummy spacer.

A method of forming a semiconductor device comprises forming a first semiconductor stack and a second semiconductor stack over a substrate, wherein each of the first and second semiconductor stack includes first semiconductor layers and second semiconductor layers including different materials and are alternately stacked up; forming a dummy spacer between the first and second semiconductor stacks, wherein the dummy spacer contacts a first sidewall of the first and second semiconductor layers of the first semiconductor stack and a first sidewall of the first and second semiconductor layers of the second semiconductor stack; selectively removing the second semiconductor layers of the first and second semiconductor stacks; and forming a metal gate structure wrapping a second sidewall, a top surface, and a bottom surface of each of the first semiconductor layers of the first and second semiconductor stacks.

In some embodiments, the exemplary method further comprises depositing a dummy spacer layer over the first and second semiconductor stacks, a portion of the dummy spacer layer filling up a space between the first and second semiconductor stacks; and isotropically removing the dummy spacer layer outside of the first and second semiconductor stack while keeping the portion of the dummy spacer layer filling up the space between the first and the second semiconductor stacks to form the dummy spacer, wherein a top surface of the dummy spacer is above top surfaces of top first semiconductor layers of the first and second semiconductor stacks. In some embodiments, the method further comprises depositing a dummy dielectric layer over the first and second semiconductor stacks and the dummy spacer. In some embodiments, the method further comprises forming a dummy gate structure over the dummy spacer, the dummy dielectric layer, and the first and second semiconductor stacks. In some embodiments, selectively removing the second semiconductor layers includes removing the dummy gate structure to form a gate trench, wherein the second sidewall of the first and second semiconductor layers are exposed in the gate trench; and selectively removing the second semiconductor layers from the gate trench, such that the second sidewall, the top surface, and the bottom surface of each first semiconductor layer are exposed in the gate trench. In some embodiments, forming the metal gate structure includes depositing a gate dielectric layer around the second sidewall, the top surface, and the bottom surface of each first semiconductor layer; depositing a work function metal over the gate dielectric layer; and forming a bulk metal over the work function metal. In some embodiments, the method further comprises removing a top portion of the dummy spacer in a channel region before forming the metal gate structure, such that a top surface of the dummy spacer is substantially coplanar with top surfaces of the first semiconductor layers.

In some embodiments, the method further comprises removing the first and second semiconductor layers in source/drain (S/D) regions of the first and second semiconductor stacks to form a source/drain (S/D) trench; and epitaxially growing S/D features in the S/D trench, wherein the S/D features are separated by the dummy spacer. In some embodiments, the method further comprises forming an interlayer dielectric (ILD) layer over the S/D features and the dummy spacer in the S/D regions. In some embodiments, the method further comprises forming S/D contacts contacting sidewalls of the dummy spacer in the S/D regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first plurality of nanostructures and a second plurality of nanostructures over a first region of a substrate;
a third plurality of nanostructures and a fourth plurality of nanostructures over a second region of the substrate;
a first dummy spacer sandwiched between and in contact with the first plurality of nanostructures and the second plurality of nanostructures; and
a second dummy spacer sandwiched between and in contact with the third plurality of nanostructures and the fourth plurality of nanostructures,
wherein a height of the first dummy spacer is greater than a height of the second dummy spacer.

2. The semiconductor structure of claim 1, further comprising:
a first bulk metal layer disposed over the first plurality of nanostructures; and
a second bulk metal layer disposed over the second plurality of nanostructures, the third plurality of nanostructures, the second dummy spacer, and the fourth plurality of nanostructures,
wherein the first bulk metal layer is isolated from the second bulk metal layer by the first dummy spacer.

3. The semiconductor structure of claim 1, wherein the first dummy spacer and the second dummy spacer comprise silicon nitride, silicon carbonitride, silicon oxide, or silicon oxycarbide.

4. The semiconductor structure of claim 1,
wherein the first region comprises a p-type well,
wherein the second region comprises an n-type well.

5. The semiconductor structure of claim 1, further comprising:
a first n-type epitaxial feature coupled to the first plurality of nanostructures; and
a second n-type epitaxial feature coupled to the second plurality of nano structures,
wherein the first dummy spacer is sandwiched between and in contact with the first n-type epitaxial feature and the second n-type epitaxial feature.

6. The semiconductor structure of claim 5, further comprising:
a first source/drain contact disposed over the first n-type epitaxial feature; and
a second source/drain contact disposed over the second n-type epitaxial feature,
wherein the first dummy spacer is sandwiched between and in contact with the first source/drain contact and the second source/drain contact.

7. The semiconductor structure of claim 6, further comprising:
a first p-type epitaxial feature coupled to the third plurality of nanostructures; and
a second p-type epitaxial feature coupled to the fourth plurality of nano structures,
wherein the second dummy spacer is sandwiched between and in contact with the first p-type epitaxial feature and the second p-type epitaxial feature.

8. The semiconductor structure of claim 7, further comprising:
- a third source/drain contact disposed over the second p-type epitaxial feature,
- wherein the second source/drain contact spans over the first p-type epitaxial feature,
- wherein the second dummy spacer is sandwiched between and in contact with the second source/drain contact and the third source/drain contact.

9. A semiconductor structure, comprising:
- a first plurality of nanostructures and a second plurality of nanostructures;
- a third plurality of nanostructures and a fourth plurality of nanostructures;
- a first dummy spacer sandwiched between and in contact with the first plurality of nanostructures and the second plurality of nanostructures;
- a second dummy spacer sandwiched between and in contact with the third plurality of nanostructures and the fourth plurality of nanostructures;
- a first n-type work function layer wrapped around each of the first plurality of nanostructures;
- a second n-type work function layer wrapping around each of the second plurality of nanostructures; and
- a p-type work function layer wrapping around each of the third plurality of nanostructures and the fourth plurality of nanostructures,
- wherein the first n-type work function layer is isolated from the second n-type work function layer by the first dummy spacer,
- wherein a portion of the p-type work function layer spans over the second dummy spacer.

10. The semiconductor structure of claim 9, wherein a height of the first dummy spacer is greater than a height of the second dummy spacer.

11. The semiconductor structure of claim 9, further comprising:
- a first bulk metal layer disposed over the first n-type work function layer; and
- a second bulk metal layer disposed over the second n-type work function layer and the p-type work function layer,
- wherein the first bulk metal layer is isolated from the second bulk metal layer by the first dummy spacer.

12. The semiconductor structure of claim 9,
- wherein the first dummy spacer and the second dummy spacer extend lengthwise along a first direction,
- wherein the first plurality of nanostructures are aligned with the second plurality of nanostructures along a second direction perpendicular to the first direction,
- wherein the third plurality of nanostructures are aligned with the fourth plurality of nanostructures along the second direction.

13. The semiconductor structure of claim 9, wherein a top surface of the second dummy spacer is substantially coplanar with a top surface of a topmost nanostructure of the third plurality of nanostructures.

14. The semiconductor structure of claim 13, further comprising:
- a gate dielectric layer disposed between the p-type work function layer and the third plurality of nanostructures,
- wherein a portion of the gate dielectric layer is disposed on the top surface of the second dummy spacer.

15. The semiconductor structure of claim 9, further comprising:
- a first n-type epitaxial feature coupled to the first plurality of nanostructures;
- a second n-type epitaxial feature coupled to the second plurality of nanostructures;
- a first source/drain contact disposed over the first n-type epitaxial feature; and
- a second source/drain contact disposed over the second n-type epitaxial feature,
- wherein the first dummy spacer is sandwiched between the first n-type epitaxial feature and the second n-type epitaxial feature as well as the first source/drain contact and the second source/drain contact.

16. The semiconductor structure of claim 15, further comprising:
- a first p-type epitaxial feature coupled to the third plurality of nanostructures;
- a second p-type epitaxial feature coupled to the fourth plurality of nanostructures; and
- a third source/drain contact disposed over the second p-type epitaxial feature,
- wherein the second source/drain contact spans over the first p-type epitaxial feature,
- wherein the second dummy spacer is sandwiched between with the first p-type epitaxial feature and the second p-type epitaxial feature as well as between the second source/drain contact and the third source/drain contact.

17. A method, comprising:
- forming a first semiconductor stack and a second semiconductor stack over a substrate, each of the first and second semiconductor stacks comprising a plurality of channel layers interleaved by a plurality of sacrificial layers;
- conformally depositing a spacer material over the first semiconductor stack and the second semiconductor stack;
- etching the spacer material to form a dummy spacer between the first semiconductor stack and the second semiconductor stack;
- removing topmost sacrificial layers in the first semiconductor stack and the second semiconductor stack until the dummy spacer rises above the first semiconductor stack and the second semiconductor stack;
- forming a dummy gate stack over channel regions of the first semiconductor stack, the second semiconductor stack, and the dummy spacer;
- recessing source/drain regions of the first semiconductor stack and the second semiconductor stack without substantially etching a source/drain region of the dummy spacer; and
- forming a first source/drain feature coupled to the channel region of the first semiconductor stack and a second source/drain feature coupled to the channel region of the second semiconductor stack.

18. The method of claim 17, further comprising:
- removing the dummy gate stack;
- selectively removing the plurality of sacrificial layers in the channel regions of the first semiconductor stack and the second semiconductor stack; and
- etching back the dummy spacer until a top surface of the dummy spacer is substantially coplanar with a top surface of a topmost channel layer in the first semiconductor stack.

19. The method of claim 17,
wherein the first semiconductor stack and the second semiconductor stack extend lengthwise along a first direction,
wherein a distance between the first semiconductor stack and the second semiconductor stack along a second direction perpendicular to the first direction is between about 8 nm and about 10 nm.

20. The method of claim 17, wherein the forming of the first semiconductor stack and the second semiconductor stack comprises forming the first semiconductor stack and the second semiconductor stack over an n-type well of the substrate.

\* \* \* \* \*